(12) United States Patent
Campanella-Pineda et al.

(10) Patent No.: US 10,277,194 B2
(45) Date of Patent: Apr. 30, 2019

(54) ACOUSTIC MEMS RESONATOR AND FILTER WITH FRACTAL ELECTRODE AND METHOD FOR PRODUCING THE SAME

(71) Applicant: GLOBALFOUNDRIES Singapore Pte. Ltd., Singapore (SG)

(72) Inventors: Humberto Campanella-Pineda, Singapore (SG); You Qian, Singapore (SG); Rakesh Kumar, Singapore (SG)

(73) Assignee: GLOBALFOUNDRIES SINGAPORE PTE. LTD., Singapore (SG)

( * ) Notice: Subject to any disclaimer, the term of this patent is extended or adjusted under 35 U.S.C. 154(b) by 61 days.

(21) Appl. No.: 15/706,304

(22) Filed: Sep. 15, 2017

(65) Prior Publication Data

US 2019/0089327 A1    Mar. 21, 2019

(51) Int. Cl.
*H03H 3/02* (2006.01)
*H03H 9/02* (2006.01)
(Continued)

(52) U.S. Cl.
CPC .......... *H03H 9/02157* (2013.01); *H03H 3/02* (2013.01); *H03H 9/0211* (2013.01);
(Continued)

(58) Field of Classification Search
CPC .... H03H 3/02; H03H 9/0211; H03H 9/02118; H03H 9/02157; H03H 9/13; H03H 9/132;
(Continued)

(56) References Cited

U.S. PATENT DOCUMENTS 5,903,087 A  * 5/1999 Mattson ................ H03H 9/132
                                                            310/327
6,215,375 B1    4/2001 Larson, III et al.
(Continued)

FOREIGN PATENT DOCUMENTS

CN       103795291 B     12/2016
FR      2 943 000 A1 *   9/2010
(Continued)

OTHER PUBLICATIONS

A. Bhadauria et al.; "Enhancing Q-Factor Using Fractal Electrodes in Film Bulk Acoustic Resonator for Wireless Applications"; Proceedings of the 2016 Asia-Pacific Microwave Conference, Dec. 5-9, 2016, 4 pages and 1 page IEEE Xplore abstract with publishing data. (Year: 2016).*

(Continued)

*Primary Examiner* — Barbara Summons
(74) *Attorney, Agent, or Firm* — Ditthavong & Steiner, P.C.

(57) ABSTRACT

Methods of designing a BAW resonator having fractal geometry and the resulting devices are provided. Embodiments include providing a fractal generator function; providing three or more line segments; applying the fractal generator function to each of the three or more line segments to form three or more respective fractal line segments, each of the three or more fractal line segments having a respective start point and endpoint and at least four sub-segments; and connecting an endpoint of each one of the three or more fractal line segments to a successive start point of another of the three or more fractal line segments to form a closed-loop contour line representative of an area of an electrode of a BAW resonator, the closed-loop contour line having a fractal dimension that is greater than one and less than two.

20 Claims, 11 Drawing Sheets

(51) Int. Cl.
*H03H 9/13* (2006.01)
*H03H 9/54* (2006.01)
*H03H 9/205* (2006.01)

(52) U.S. Cl.
CPC ............ *H03H 9/132* (2013.01); *H03H 9/205* (2013.01); *H03H 9/54* (2013.01)

(58) Field of Classification Search
CPC ............ H03H 9/15; H03H 9/17; H03H 9/205; H03H 9/54; H03H 9/56
USPC .................................. 333/187, 189; 310/365
See application file for complete search history.

(56) References Cited

U.S. PATENT DOCUMENTS

| | | |
|---|---|---|
| 6,812,619 B1 | 11/2004 | Kaitila et al. |
| 7,245,196 B1 | 7/2007 | Baliarda et al. |
| 7,466,213 B2 | 12/2008 | Lobl et al. |
| 7,477,000 B2 * | 1/2009 | Huang ............... H03H 9/02921 310/313 B |
| 8,008,993 B2 | 8/2011 | Milsom et al. |
| 9,148,117 B2 | 9/2015 | Burak et al. |
| 9,246,473 B2 | 1/2016 | Burak et al. |
| 9,450,565 B2 | 9/2016 | Tajic |
| 2008/0179990 A1 * | 7/2008 | Huang ............... H03H 9/02921 310/313 B |

FOREIGN PATENT DOCUMENTS

| | | |
|---|---|---|
| TW | 200605499 A | 2/2006 |
| TW | 201212372 A1 | 3/2012 |

OTHER PUBLICATIONS

Office Action for the related Taiwanese Patent Application No. 106135335, dated Oct. 12, 2018, 6 pages.

\* cited by examiner

ACOUSTIC MEMS RESONATOR AND FILTER WITH FRACTAL ELECTRODE AND METHOD FOR PRODUCING THE SAME

TECHNICAL FIELD

The present disclosure relates to acoustic filters and resonators. The present disclosure is particularly applicable to BAW (bulk acoustic wave) resonators and filters for use in wireless mobile device and small cell applications.

BACKGROUND

BAW resonators, filters and other components are widely used in high frequency applications such as 4G or long term evolution (LTE) communications to remove unwanted frequencies and improve signal quality. With an effective operating frequency range of 2 gigahertz (GHz) to 16 GHz, BAW components also feature the design advantage of requiring decreased size to accommodate higher bandwidths. This limits their circuitry footprint while making them practical for use in demanding 3 G, 4G and future broadband applications. However, BAW filters are susceptible to unwanted lateral wave propagation that impacts the quality (Q) factor—a measure of the quality of a filter to selectively filter signals at certain frequencies. Lateral waves also cause BAW filters to exhibit spurious resonance mode behavior that superposes the target (expected) BAW resonance mode. Resultantly, the range of frequencies or wavelengths that pass through the BAW filter are unreliable.

A need therefore exists for methodology enabling formation of a BAW resonator and filter that exhibits a high Q factor and improved lateral wave response and the resulting device.

SUMMARY

An aspect of the present disclosure is a method of designing a BAW resonator having fractal geometry.

Another aspect of the present disclosure is a BAW resonator having fractal dimensions.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method including: providing a fractal generator function; providing three or more line segments; applying the fractal generator function to each of the three or more line segments to form three or more respective fractal line segments, each of the three or more fractal line segments having a respective start point and endpoint and at least four sub-segments; and connecting an endpoint of each one of the three or more fractal line segments to a successive start point of another of the three or more fractal line segments to form a closed-loop contour line representative of an area of an electrode of a BAW resonator, the closed-loop contour line having a fractal dimension that is greater than one and less than two.

Aspects of the present disclosure include the fractal generator function being a Koch function, an other parameterized fractal function or an arbitrary suitable function that is subjected to parametrization and fractalization. Other aspects include a parameter of the Koch function including a unit length of the three or more line segments, an angular value of an equilateral triangle, a perimeter of an equilateral triangle, an area of an equilateral triangle, a height of an equilateral triangle, an iteration order value or a combination thereof. Another aspect includes the Koch function forming the three or more line segments into a snowflake-shaped closed-loop contour line. Further aspects include determining whether a target Q factor, a target area and a target perimeter is met for the BAW resonator based on analysis of the closed-loop contour line and specification information for the BAW resonator. Another aspect includes the determining of whether the target Q factor, the target area and the target perimeter are met including analyzing the closed-loop contour line based on modeling or particle counting. Yet another aspect includes applying the fractal generator function to each of the three or more fractal line segments of the closed-loop contour line to form an updated closed-loop contour line until the target Q factor, target area and target perimeter are met for the BAW resonator.

Another aspect of the present disclosure is a device including: a first electrode made of conductive material, a perimeter of at least one first electrode being defined by a closed-loop contour with fractal dimensions greater than one and less than two and a parameterized fractal function or an arbitrary suitable function that is subjected to parametrization and fractalization; an acoustic layer adjacent to the first electrode, the first electrode interfacing with a first plane of the acoustic layer; and a second electrode adjacent to the acoustic layer, the second electrode made of conductive material and interfacing with a second plane of the acoustic layer.

Aspects of the device include the second electrode having the fractal dimensions and being patterned based on the parameterized fractal function or the arbitrary suitable function that is subjected to parametrization and fractalization. Other aspects include the parameterized fractal function being a Koch function, a Cesare function, a Cantor function, a Sierpienski function, or a Peano function. Another aspect includes the acoustic layer being a piezoelectric material. Further aspects include the interfacing of the second electrode with the second plane the acoustic layer and the interfacing of the first electrode with the first plane of the acoustic layer forms a resonator or a plurality of BAW resonators, respectively. Another aspect includes interconnects for operatively coupling the plurality of BAW resonators to form an acoustic filter wherein the interfacing of the second electrode and the first electrode forms more than one resonator.

A further aspect of the present disclosure is a method including: providing a target Q factor for a resonator; providing a first pattern representative of a first electrode, the pattern having a closed-loop contour line having fractal dimensions based on a parameterized fractal function or an arbitrary suitable function that is subjected to parametrization and fractalization, the fractal dimensions being greater than one and less than two; providing a second pattern representative of an area of a second electrode to be layered with the first electrode, the layering of the second pattern and the first pattern representing an effective area of the resonator; and determining whether the target Q factor is met for the resonator based on the area and the perimeter of the closed-loop contour line.

Aspects of the present disclosure include the determining of whether the target Q factor is met including analyzing the closed-loop contour line based on modeling or particle counting. Further aspects include updating the first pattern until the target Q factor is met for the resonator, the target Q factor being based on specification information for the resonator; and storing the updated first pattern as a final pattern for forming the first electrode once the Q factor is met. Another aspect includes wherein the step of updating the first pattern includes applying a fractal generator function to the closed-loop contour line, the fractal generator function having self-similarity to the fractal dimensions of the closed-loop contour line. Yet another aspect includes updating the second pattern until the target Q factor is met for the resonator, the target Q factor being based on specification information for the resonator; and storing the updated second pattern as a final pattern for forming the second electrode once the target Q factor is met. Another aspect includes wherein the step of updating the second pattern includes applying a fractal generator function to the closed-loop contour line of the second pattern, the closed-loop contour line of the second pattern having fractal dimensions based on a parameterized fractal function or an arbitrary suitable function that is subjected to parametrization and fractalization, the fractal dimensions being greater than one and less than two. A further aspect includes wherein the fractal generator function has self-similarity to the fractal dimensions of the closed-loop contour line of the second pattern.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which.

DETAILED DESCRIPTION

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves the current problem of BAW components, such as resonators and filters, being susceptible to unwanted lateral waves that degrade performance. The problem is solved, inter alia, by forming an electrode of a BAW resonator featuring fractal dimensions designed based on a parameterized fractal function or an arbitrary suitable function that is subjected to parametrization and fractalization. The present disclosure further addresses and solves the problem of designing BAW components with improved Q factor. The problem is solved, inter alia, by determining a target Q factor to be met based on an area of a closed-loop contour line having fractal dimensions generated based on a parameterized fractal function or an arbitrary suitable function that is subjected to parametrization and fractalization.

Methodology in accordance with embodiments of the present disclosure includes providing a fractal generator function. Three or more line segments are provided and the fractal generator function is applied to each of the three or more line segments to form three or more respective fractal line segments, each of the three or more fractal line segments having a respective start point and endpoint and at least four sub-segments. An endpoint of each one of the three or more fractal line segments is connected to a successive start point of another of the three or more fractal line segments to form a closed-loop contour line representative of an area of an electrode of a BAW resonator, the closed-loop contour line having a fractal dimension that is greater than one and less than two.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

Figure 1A:
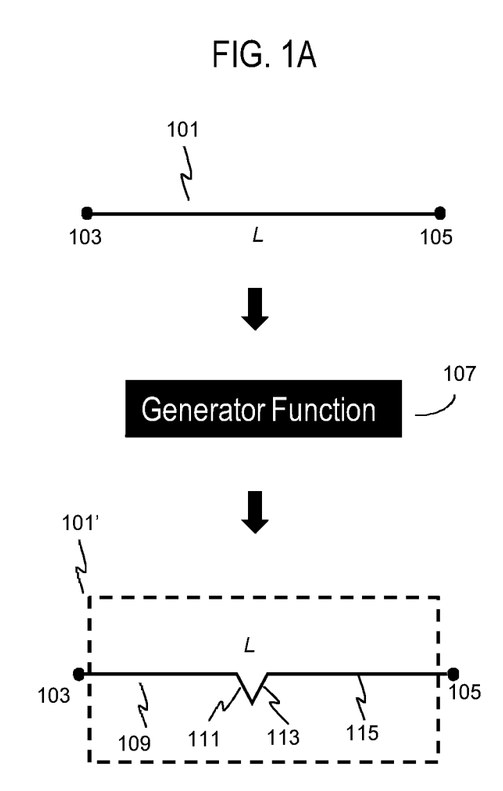
FIGS. 1A through 1C schematically illustrate a process flow for designing a BAW resonator with fractal dimensions, in accordance with an exemplary embodiment.
Figure 1B:
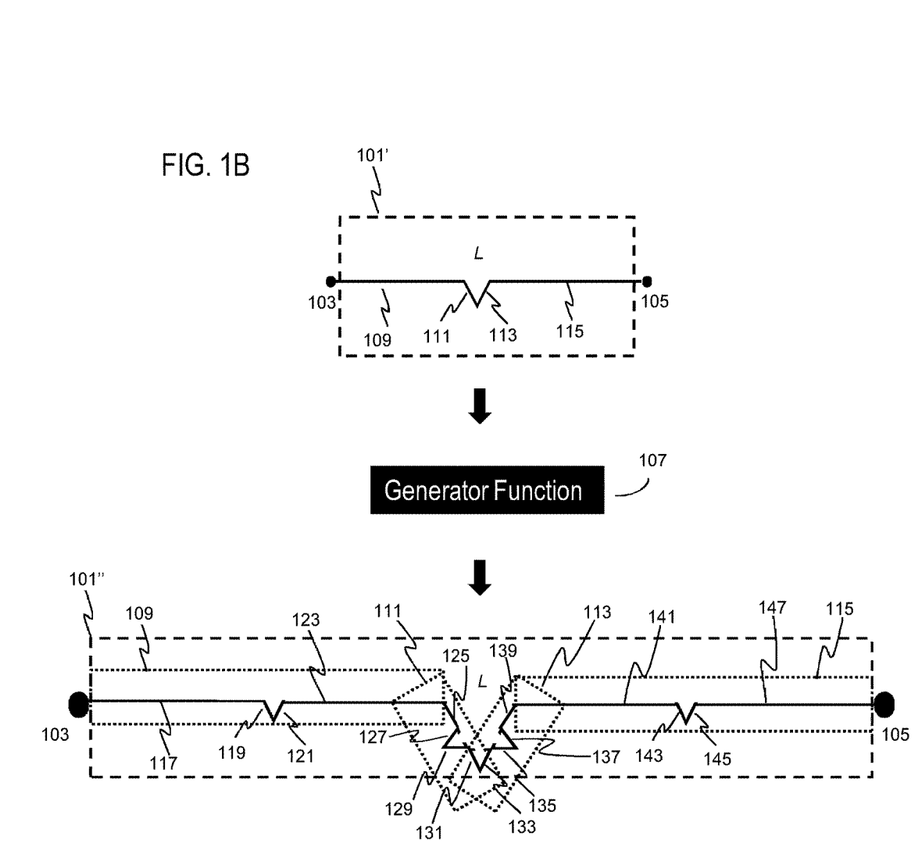
Figure 1C:
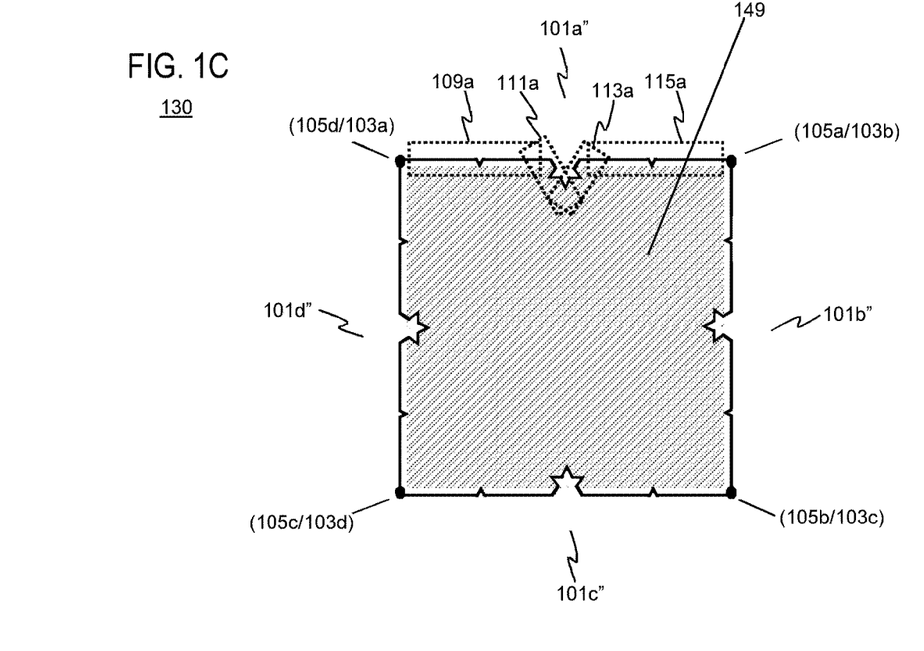

FIGS. 1A through 1C schematically illustrate a process flow for designing a BAW resonator with fractal dimensions, in accordance with an exemplary embodiment. By way of example, said process flow may be performed as one or more computer-driven, machine-driven, design-based, manufacturing-based or other automated executions (not shown for illustrative convenience). The figures depict a self-similar relationship existing between various line segments pursuant to processing by a generator function for forming a closed-loop contour line representing an area/perimeter of an exemplary BAW resonator. In various embodiments, fractal dimensions refer to patterning of an electrode based on a parameterized fractal function or an arbitrary suitable function that is subjected to parametrization and fractalization and/or fractal dimensions of the closed-loop contour line that defines the perimeter of a BAW resonator.

Referring to FIG. 1A, a line segment 101 of length L having a starting point 103 and terminating at an endpoint 105 (Iteration i=0 (no fractalization)) is provided as an input to a generator function 107. The generator function 107 may be any known parameterized fractal function or arbitrary suitable function that is subjected to parametrization and fractalization, executed as one or more mathematical operations, for transforming and/or operating upon data input to yield an expected processing result. By way of example, in this instance, the generator function 107 is a Koch function, capable of recursively altering a line segment 101 to produce a fractal line segment 101' having fractal dimensions (Iteration i=1). In certain embodiments, the input to the generator function 107 may include the length L of the line segment 101, an angular value, height, perimeter or area of an equilateral triangle to be mathematically imposed upon the line segment 101, an iteration order value i for processing of the input or a combination thereof.

Fractal line segment 101' represents an output produced by the generator function 107 as a result of the aforementioned input. In each instance, the fractal line segment corresponding to the line segment, e.g., line segment 101 and fractal line segment 101', will have, at least, four new sub-segments, e.g., sub-segments 109, 111, 113 and 115. By way of example, the output (fractal line segment 101') is a version of line segment 101 having the same length L but with a triangular-shaped element imposed upon a portion of the line segment 101 to form a fractal. A fractal is any contiguous arrangement of lines or patterns having self-similar structure, i.e., it can be defined in terms of itself.

Referring to FIG. 1B, the fractal line segment 101' may then be inputted to the generator function 107 to produce a further iteration of fractal line segment 101', namely, fractal line segment 101"(Iteration i=2), which has the same length L as the line segment 101 and fractal line segment 101', but with a triangular-shaped element imposed on each of the sub-segments 109, 111, 113 and 115, thereby forming at least four new sub-segments per the original sub-segments of fractal line segment 101', e.g., 117, 119, 121 and 123; 125, 127, 129 and 131; 133, 135, 137 and 139; and 141, 143, 145 and 147, respectively (i.e., $2^4$=16 for each of sub-segments 109-115). It should be noted that the scale of fractal line segment 101" of FIG. 1B is for illustrative convenience only and that the length L is the same for the line segment 101 and fractal line segments 101' and 101". Per this example, for each iteration i of the generator function 107, the number of sub-segments is given as:

Number of sub-segments=$2^{i \times N}$, where N=i=2 in this example.

Referring to FIG. 1C, a closed-loop contour line 130 is formed based on the iterative process flow described with respect to FIGS. 1A and 1B. In this instance, four line segments, e.g., line segments 101a, 101b, 101c and 101d (not shown for illustrative convenience), each having a length L and start and end points 103a and 105a, 103b and 105b, 103c and 105c and 103d and 105d, respectively, are provided. The four lines segments 101a, 101b, 101c and 101d are then inputted to the generator function 107, e.g., a Koch function, and processed through two iterations, as described above. Consequently, each resultant fractal line segment 101a", 101b", 101c" and 101d" has 16 sub-segments ($2^{i \times N}$) identical to the sub-segments of fractal line segment 101" of FIG. 1B, e.g., 117, 119, 121 and 123; 125, 127, 129 and 131; 133, 135, 137 and 139; and 141, 143, 145 and 147. Next, an endpoint of each of the fractal line segments 101a", 101b", 101c" and 101d", e.g., 105a, 105b, 105c and 105d, respectively, is connected to a successive start point of another of four line segments, e.g., 103a, 103b, 103c and 103d, respectively. For example, the endpoint 105d of fractal line segment 101d" is coordinated to intersect the start point 103a of fractal line segment 101a" at a common point (105d/103a) and so on until all the fractal line segments 101a", 101b", 101c" and 101d" form the closed-loop 130. The common points correspond to two-dimensional coordinates x and y for defining a relative position and/or orientation of corresponding fractal line segments 101a", 101b", 101c" and 101d" for forming the closed-loop 130. Thus, the closed-loop contour line 130 is produced from the addition of/connection of line segments 101a", 101b", 101c" and 101d".

In the exemplary embodiment, the resulting region enclosed by said closed-loop contour line 130, depicted as shaded area 149, is representative of an area of an electrode. The perimeter of said closed-loop contour line 130, given as the sum of the lengths of fractal line segments 101a", 101b", 101c" and 101d", is representative of the perimeter of the electrode. Per this approach, the closed-loop contour line 130 features fractal dimensions, e.g., 109a, 111a, 113a and 115a; 109b, 111b, 113b and 115b; 109c, 111c, 113c and 115c; and 109d, 111d, 113d and 115d (fractal dimensions 109b, 111b, 113b 115b through 109d, 111d, 113d and 115d not shown for illustrative convenience), pursuant to the generator function 107 and as shown in greater detail in FIG. 1B. As will be discussed further herein, the inclusion of fractal dimensions within the design and fabrication of an electrode of a BAW resonator results in an improved Q factor.

While the aforementioned embodiments pertain to a Koch function of the generator 107, any other parameterized fractal function or an arbitrary suitable function that is subjected to parametrization and fractalization may alternatively be employed. For example, the generator 107 may perform a parameterized fractal function such as a Cesare function, Cantor function, Sierpienski function, Peano function, triangular pulse function, square pulse function or any other function that is fractalized to improve the perimeter to area ratio of the expected resonator and the Q factor thereof.

Figure 2A:
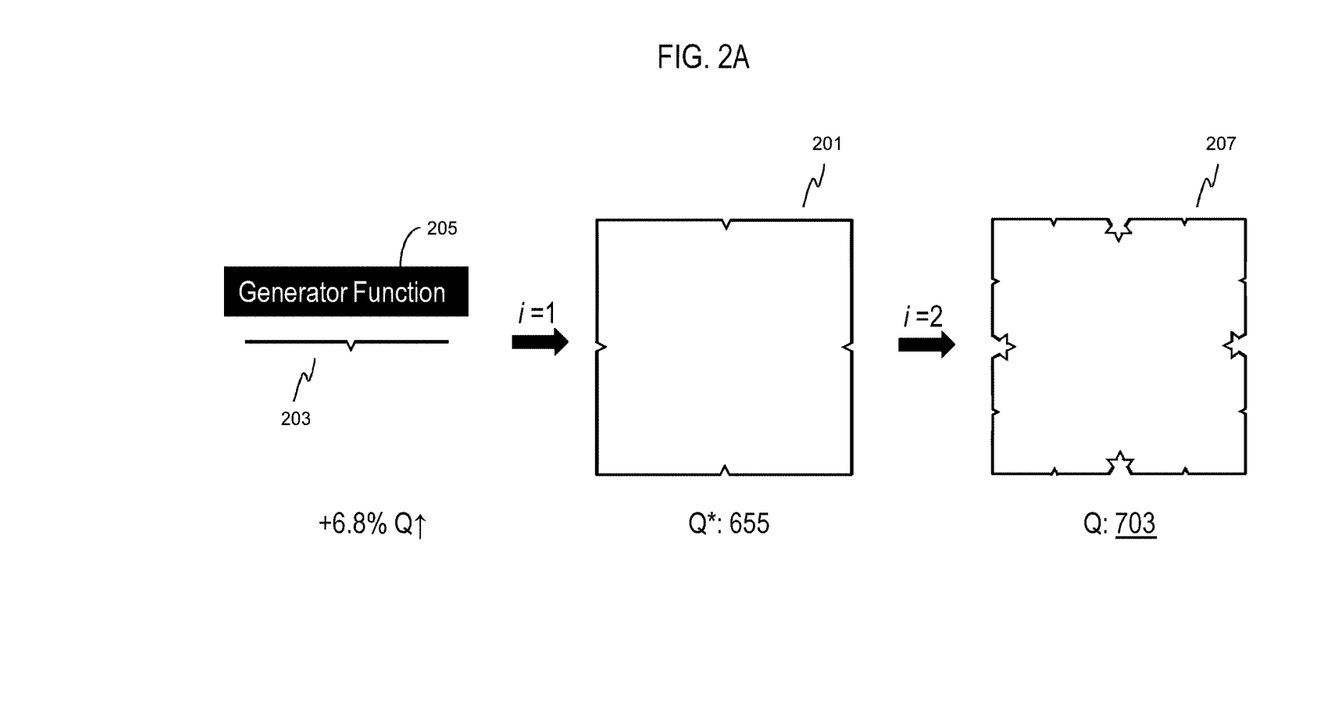
FIGS. 2A through 2C schematically illustrate exemplary performance metrics for a BAW resonator having fractal dimensions, in accordance with another exemplary embodiment.
Figure 2B:
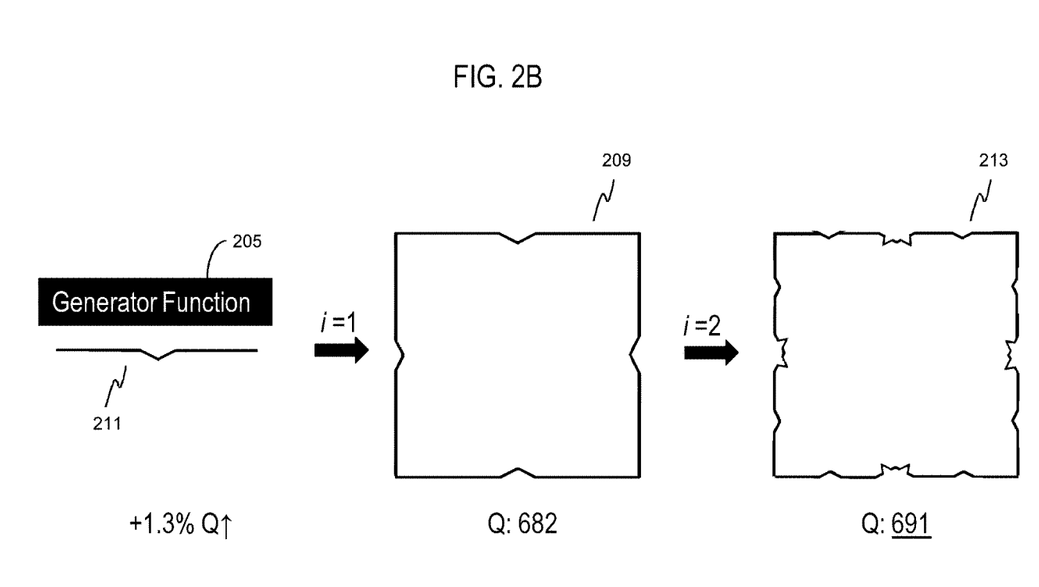
Figure 2C:
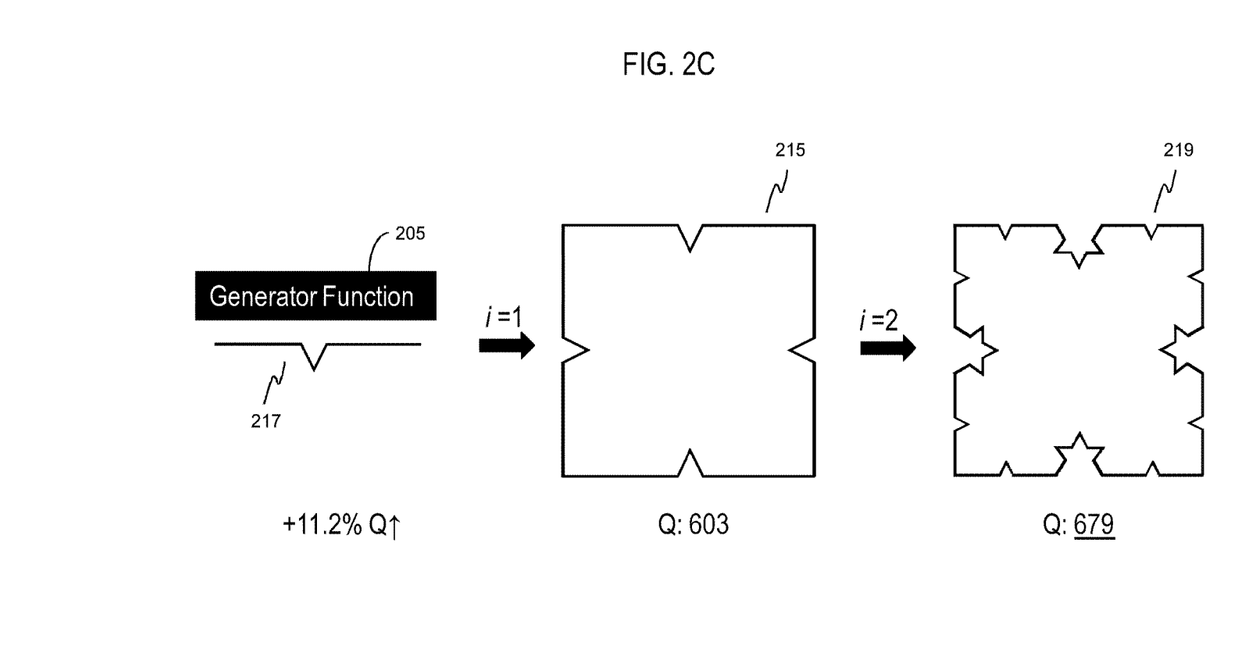

FIGS. 2A through 2C illustrate exemplary performance metrics for a BAW resonator having fractal dimensions, in accordance with another exemplary embodiment. In FIGS. 2A through 2C, Q factors associated with different closed-loop contour lines having different fractal dimensions are shown. The quality factor of a filter or other tuned circuit provides an indication of its performance in a high frequency environment. Specifically, the Q factor indicates the energy losses within a BAW filter, i.e., made up of multiple BAW resonators. With greater energy conservation or Q factor, the BAW filter circuit becomes sharper and more attuned to the identification of signals corresponding to the frequency ranges it is designed to filter. Conversely, poor energy conservation or Q factor, translates into lessened performance of the filter to identify specific signals within its intended bandwidth range.

The Q factor associated with a BAW filter may vary depending on its design characteristics. Among other factors, the size and shape of the filter influences its level of resonance. Referring to FIG. 2A, a Q factor of 665 is determined (e.g., via analysis or simulation) to occur for a closed-loop contour line 201 having self-similarity to a fractal segment 203 as produced by a first order iteration (i=1) of the generator function 205. The fractal segment 203 is characterized by a specific triangular area, height, etc. Further fractalization of the same fractal line segment 203, corresponding to a second order (i=2) iteration of the generator function 205, results in formation of a closed-loop contour line 207 with a corresponding Q factor of 703. This results in a 6.8% increase in Q factor.

In FIG. 2B, a Q factor of 682 is determined (e.g., via analysis or simulation) to occur for a closed-loop contour line 209 having self-similarity to a fractal line segment 211 as produced by a first order iteration (i=1) of the generator function 205. The fractal line segment 211 is characterized by a specific triangular area, height, etc. Further fractalization of the same fractal line segment 211, corresponding to a second order (i=2) iteration of the generator function 205, results in formation of a closed-loop contour line 213 with a Q factor of 691. This corresponds to a 1.3% increase in Q factor.

In FIG. 2C, a Q factor of 603 is determined (e.g., via analysis or simulation) to occur for a closed-loop contour line 215 having self-similarity to a fractal line segment 217 as produced by a first order iteration (i=1) of the generator function 205. The fractal line segment 217 is characterized by a specific triangular area, height, etc. Further fractalization of the same fractal line segment 217, corresponding to a second order (i=2) iteration of the generator function 205, results in formation of a closed-loop contour line 219 with a Q factor of 679. This corresponds to an 11.2% increase in Q factor.

In the exemplary embodiments of FIGS. 2A through 2C, fractalization from i=1 to i=2 ($1^{st}$ order to $2^{nd}$ order Koch structure) results in improved Q factor. In other embodiments, additional iterations may be performed within design and fabrication limits. The determined Q factor is based in part on the resulting perimeter and/or area of an electrode of a BAW resonator having fractal dimensions of respective closed-loop contour lines 201 and 207, 209 and 213 and 215 and 219 of FIGS. 2A through 2C, respectively. Q factors may be calibrated for benchmarking purposes during analysis and analysis techniques may include modeling, particle counting or the like.

Figure 3A:
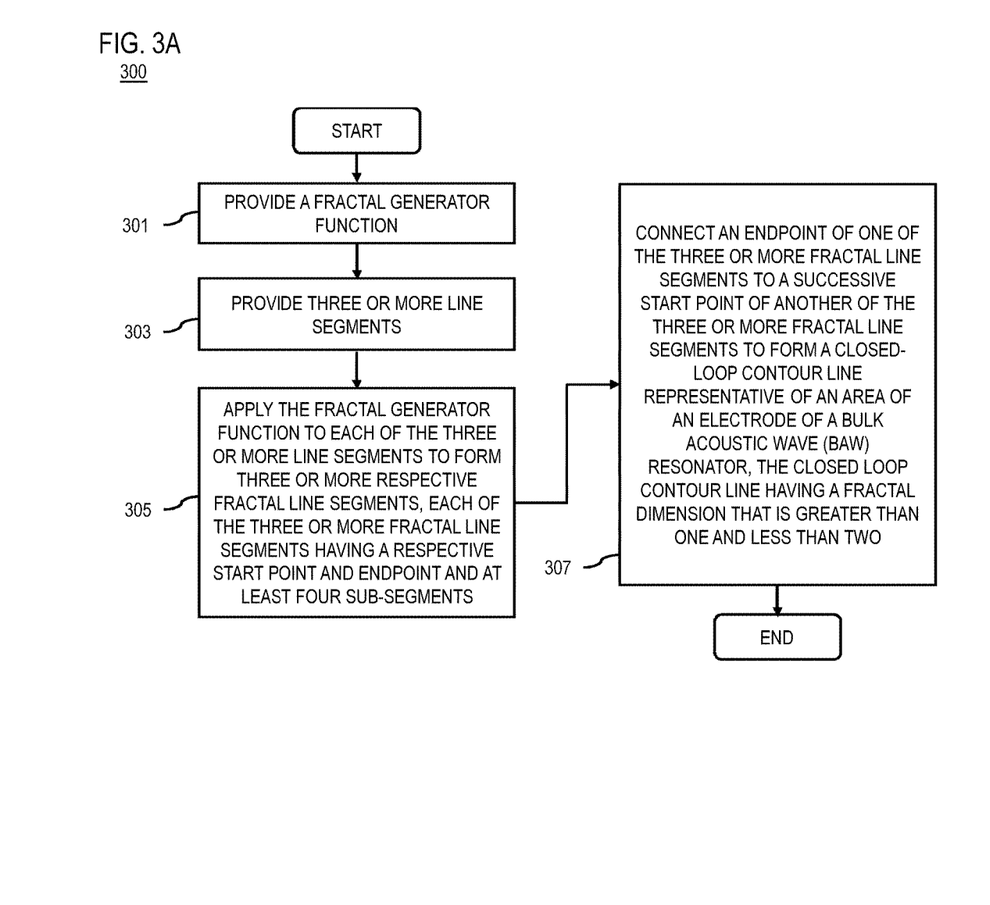
FIGS. 3A and 3B are flowcharts of a process for designing a BAW resonator having fractal dimensions, in accordance with another exemplary embodiment.
Figure 3B:
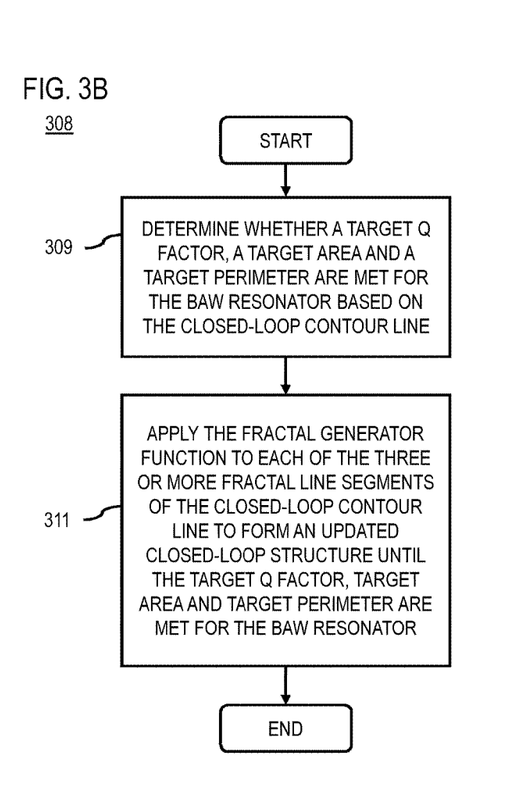

FIGS. 3A and 3B are flowcharts of a process for designing a BAW resonator having fractal dimensions, in accordance with another exemplary embodiment. In one embodiment, the process 300 is implemented as one or more software instructions and/or for instance, in a chip set including a processor and a memory (not shown for illustrative convenience).

In steps 301 and 303 of process 300 (FIG. 3A), a fractal generator function and three or more line segments are provided, respectively. As noted previously, the fractal generator function may be a Koch function, other parameterized fractal function or an arbitrary suitable function that is subjected to parametrization and fractalization for operating upon the three or more line segments. A parameter of the Koch function may include a unit length of the three or more line segments, an angular value of an equilateral triangle, a perimeter of an equilateral triangle, an area of an equilateral triangle, a height of an equilateral triangle, an iteration order value or a combination thereof. The fractal dimensions are greater than one and less than two and when the Koch function is used, the three or more line segments are patterned like a snowflake-shaped closed-loop contour line or other recursive structure.

In step 305, the fractal generator function is applied to each of the three or more line segments to form three or more respective fractal line segments, each of the three or more fractal line segments having a respective start point and endpoint and, at least, four sub-segments. In step 307, the endpoints of one of the three or more fractal line segments are connected to a successive start point of another of the three or more fractal line segments to form a closed-loop contour line representative of an area of an electrode of a BAW resonator, the closed-loop contour line having a fractal dimension that is greater than one and less than two.

In step 309 of process 308 (FIG. 3B), whether a target Q factor, a target area and a target perimeter are met is determined for the BAW resonator based on the closed-loop contour line. As noted previously, the analysis of the closed-loop contour line is based on modeling or particle counting. Furthermore, the target Q factor, target area and target perimeter are based on specification information for the BAW resonator.

In step 311, the fractal generator function is applied to each of the three or more fractal line segments of the closed-loop contour line to form an updated closed-loop structure until the target Q factor, target area and target perimeter is met for the BAW resonator. The updated closed-loop contour line includes three or more updated fractal line segments having self-similarity to the fractal generator function and to each of the three or more fractal line segments. As noted previously, the updated closed-loop contour line corresponds to an ith iteration of the fractal generator function for achieving increased fractalization of the resulting electrode of the BAW resonator.

Figure 4A:
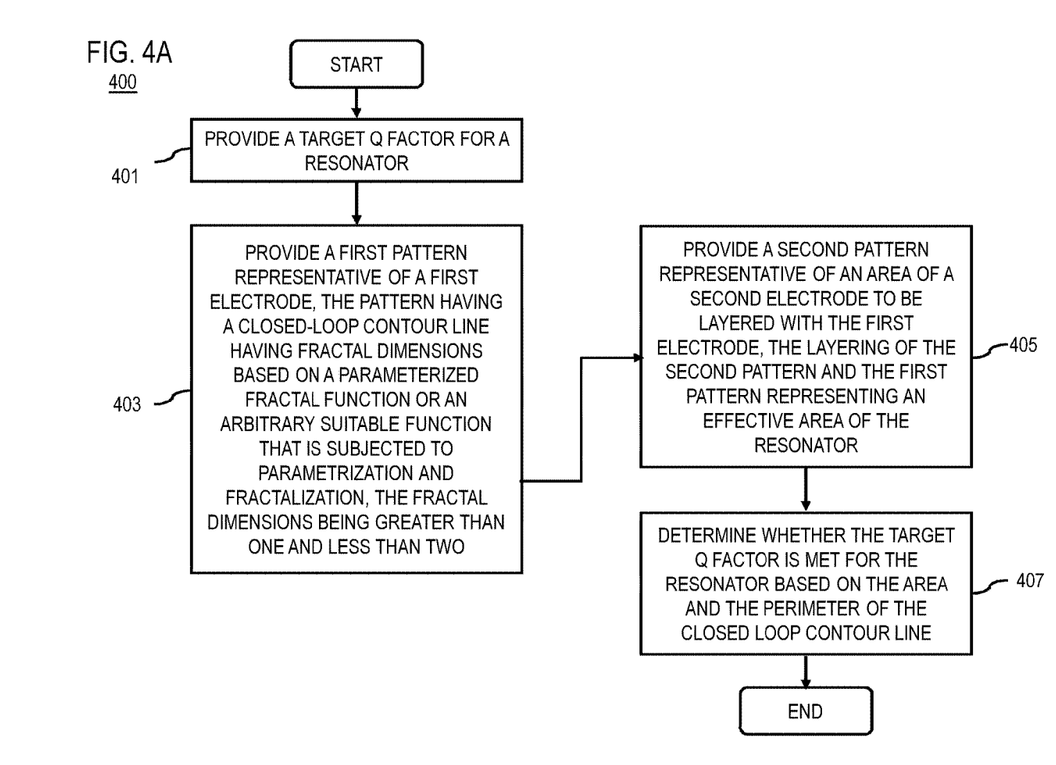
FIGS. 4A through 4C are flowcharts of a process for improving the Q factor of a BAW resonator, in accordance with another exemplary embodiment.
Figure 4B:
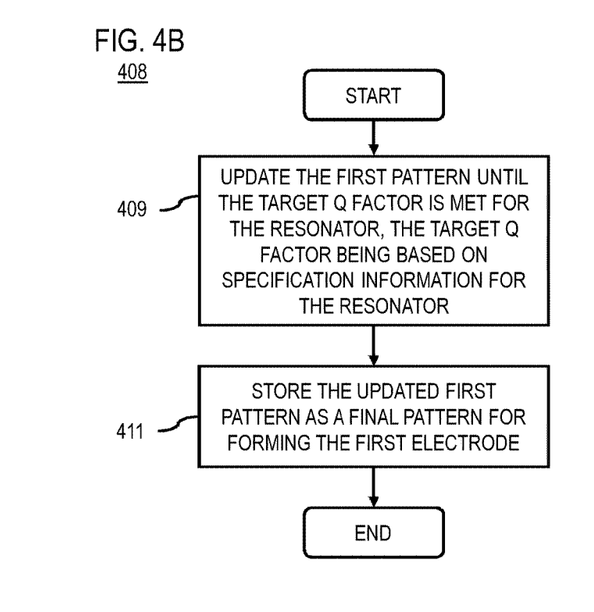
Figure 4C:
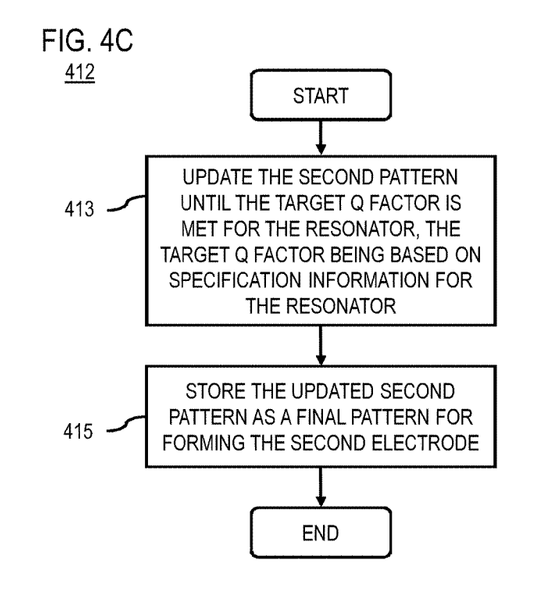

FIGS. 4A through 4C are flowcharts of a process for improving the Q factor of a BAW resonator, in accordance with another exemplary embodiment. In one embodiment, the process 400 is implemented as one or more software instructions and/or for instance, in a chip set including a processor and a memory (not shown for illustrative convenience).

In step 401 of process 400 (FIG. 4A), a target Q factor for a resonator is provided. In step 403, a first pattern representative of a first electrode is provided, e.g., as an input. As noted above, the pattern has a closed-loop contour line having fractal dimensions based on a parameterized fractal function or an arbitrary suitable function that is subjected to parametrization and fractalization, the fractal dimension being greater than one and less than two. Wherein the parameterized fractal function is a Koch function, the closed-loop contour line is patterned into a snowflake-shaped closed-loop contour line.

In step 405, a second pattern representative of an area of a second electrode to be layered with the first electrode is provided. The layering of the second pattern and the first pattern represent an effective area of the resonator. Whether the target Q factor is met for the resonator based on the area and the perimeter of the closed-loop contour is determined in step 407. This may include analyzing the closed-loop contour line based on modeling or particle counting.

In step 409 of process 408 (FIG. 4B), the first pattern is updated until the target Q factor is met for the resonator. This may include, for example, updating the first pattern including applying a fractal generator function to the closed-loop contour line, the fractal generator function having self-similarity to the fractal dimensions of the closed-loop contour line. As mentioned previously, the target Q factor is based on specification information for the resonator. In step 411, the updated first pattern is stored as a final pattern for forming the first electrode.

In step 413 of process 412 (FIG. 4C), the second pattern is updated until the target Q factor is met for the resonator, the target Q factor being based on specification information for the resonator. The design characteristics of the second pattern may vary depending on the application requirements for the resonator. For example, in one instance, the second pattern may have a closed-loop contour line having fractal dimensions based on the parameterized fractal function or the arbitrary suitable function that is subjected to parametrization and fractalization. Under this scenario, the fractal dimensions are greater than one and less than two—thus matching the characteristics of the first pattern and first electrode. Alternatively, the second pattern may be without fractal dimensions, relegating the fractal geometry of the resulting resonator to only the first electrode.

In step 415, the updated second pattern is stored as a final pattern for forming the second electrode. In certain instances, the storing steps 411 and 415 may correspond to fulfillment of a design, planning, fabrication or manufacturing process. For example, the final pattern may be rendered to a photolithography processing device for enabling development of the electrode.

Figure 5:
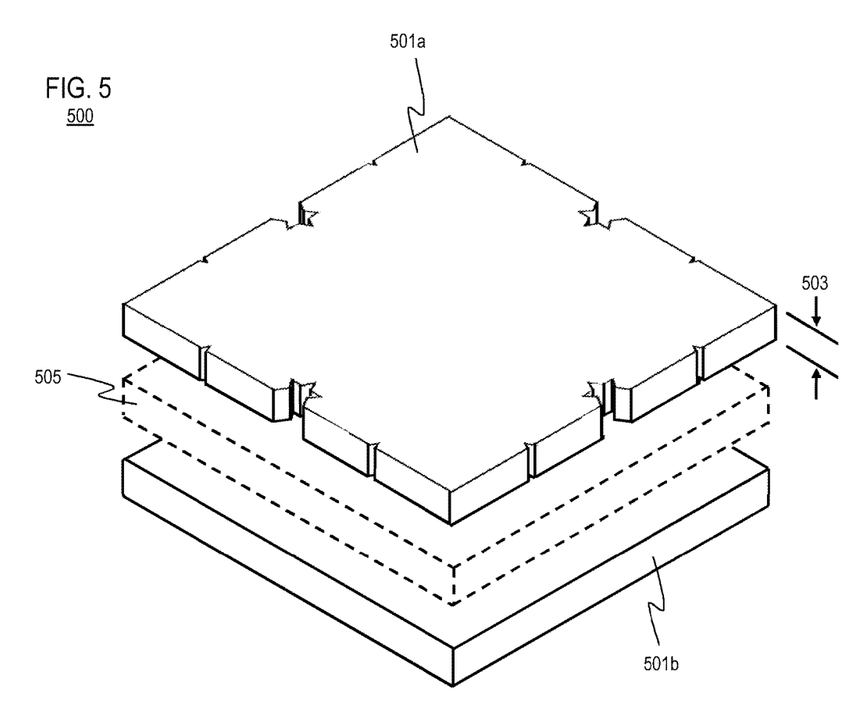
FIG. 5 schematically illustrates an overlapping view of elements of a BAW resonator having electrodes with fractal geometry, in accordance with a further exemplary embodiment.

FIG. 5 schematically illustrates an overlapping view of the elements of a BAW resonator having electrodes with fractal geometry, in accordance with a further exemplary embodiment. The BAW resonator 500 includes a first electrode 501a made of a conductive material, the electrode having fractal dimensions and patterned based on a parameterized fractal function or an arbitrary suitable function that is subjected to parametrization and fractalization for providing an effective area of a resonator. The area of the resonator 500 may be defined by a closed-loop contour line representative of the area of the first electrode 501a, the closed-loop contour line having the fractal dimensions and self-similarity to the parameterized fractal function or the arbitrary suitable function that is subjected to parametrization and fractalization.

As depicted herein, the fractal dimensions are etched into the electrode 501a throughout its thickness 503 for impacting standing waves resonated through an acoustic layer 505 adjacent to the first electrode. The first electrode 501a interfaces with the first plane of the acoustic layer 505. By way of example, the acoustic layer 505 is formed of a thin-film piezoelectric material.

The BAW resonator 500 further includes a second electrode 501b made of conductive material. In this instance, the second electrode 501b interfaces with a second plane of the acoustic layer 505 for providing an effective area of a resonator. It is noted that the overlapping area of the first and second electrodes 501a and 501b, respectively, form the total area of the BAW resonator 500. Per this configuration, the acoustic layer 505 is sandwiched between the first and second electrodes 501a and 501b, respectively.

In this instance, the second electrode 501b is a square-shaped electrode without fractal dimensions. Alternatively, the second electrode 501b may have fractal dimensions and be patterned based on the parameterized fractal function or the arbitrary suitable function that is subjected to parametrization and fractalization used to form the first electrode 501a. Either approach may be determined and applied accordingly depending on the desired Q factor and/or application requirements.

As a fully formed resonator 500 having fractal dimensions, the resonator may be further configured to one or more Bragg reflector layers that are further layered atop a substrate (not shown for illustrative convenience) in the configuration of a solidly-mounted BAW.

Alternatively, a BAW filter may include a plurality of BAW resonators 500 (not shown for illustrative convenience). Each of the BAW resonators 500 has electrodes with fractal dimensions based on a parameterized fractal function or an arbitrary suitable function that is subjected to parametrization and fractalization. The BAW filter may further include interconnects for operatively coupling the plurality of BAW resonators to form an acoustic filter. The interconnects may include a wire, channel or other connection point between respective BAW resonators 500 for coupling them to one another to function as an acoustic filter. In certain embodiments, the plurality of BAW resonators 500 may be interconnected according to any known design configurations for achieving varying operational results.

The embodiments of the present disclosure can achieve several technical effects including enabling the formation and design of BAW components with high Q and smoother frequency response relative to known BAW devices without requiring the use of supplemental components such as rings or filaments. Rather, fractal elements are designed and manufactured into the electrodes of a BAW resonator for achieving fractal geometric designs without the need for expanded circuitry footprint. The present disclosure further enjoys a method to better design an electrode with an effective perimeter to area ratio for 'weakening' the effects of lateral modes. Embodiments of the present disclosure enjoy utility in various industrial applications as, for example, microprocessors, smart phones, mobile phones, cellular handsets, set-top boxes, DVD recorders and players, automotive navigation, printers and peripherals, networking and telecom equipment, gaming systems, and digital cameras. The present disclosure therefore enjoys industrial applicability in any of various types of devices including a BAW resonator or filter.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure can use various other combinations and embodiments and is capable of any changes or modifications within the scope of the inventive concept as expressed herein.

What is claimed is:

1. A method comprising:
   providing a fractal generator function;
   providing three or more line segments;
   applying the fractal generator function to each of the three or more line segments to form three or more respective fractal line segments, each of the three or more fractal line segments having a respective start point and endpoint and at least four sub-segments; and
   connecting an endpoint of each one of the three or more fractal line segments to a successive start point of another of the three or more fractal line segments to form a closed-loop contour line representative of an area of an electrode of a bulk acoustic wave (BAW) resonator, the closed-loop contour line having a fractal dimension that is greater than one and less than two.

2. The method according to claim 1, wherein the fractal generator function is a Koch function, an other parameterized fractal function or an arbitrary suitable function that is subject to parametrization and fractalization.

3. The method according to claim 2, wherein a parameter of the Koch function includes a unit length of the three or more line segments, an angular value of an equilateral triangle, a perimeter of an equilateral triangle, an area of an equilateral triangle, a height of an equilateral triangle, an iteration order value or a combination thereof.

4. The method according to claim 2, wherein the Koch function forms the three or more line segments into a snowflake-shaped closed-loop contour line.

5. The method according to claim 1, further comprising:
determining whether a target quality (Q) factor, a target area and a target perimeter are met for the BAW resonator based on analysis of the closed-loop contour line and specification information for the BAW resonator.

6. The method according to claim 5, wherein the determining of whether the target Q factor, the target area and the target perimeter are met includes analyzing the closed-loop contour line based on modeling or particle counting.

7. The method according to claim 5, further comprising:
applying the fractal generator function to each of the three or more fractal line segments of the closed-loop contour line to form an updated closed-loop contour line until the target Q factor, target area and target perimeter are met for the BAW resonator.

8. A device comprising:
a first electrode made of conductive material, a perimeter of at least one first electrode being defined by a closed-loop contour with fractal dimensions greater than one and less than two and a parameterized fractal function or an arbitrary suitable function that is subjected to parametrization and fractalization;
an acoustic layer adjacent to the first electrode, the first electrode interfacing with a first plane of the acoustic layer; and
a second electrode adjacent to the acoustic layer, the second electrode made of conductive material and interfacing with a second plane of the acoustic layer.

9. The device according to claim 8, wherein the second electrode has the fractal dimensions and is patterned based on the parameterized fractal function or the arbitrary suitable function that is subjected to parametrization and fractalization.

10. The device according to claim 9, wherein the parameterized fractal function comprises a Koch function, a Cesare function, a Cantor function, a Sierpienski function, or a Peano function.

11. The device according to claim 8, wherein the acoustic layer is a piezoelectric material.

12. The device according to claim 8, wherein the interfacing of the second electrode with the second plane of the acoustic layer and the interfacing of the first electrode with the first plane of the acoustic layer forms a resonator or a plurality of bulk acoustic wave (BAW) resonators, respectively.

13. The device according to claim 12, wherein the plurality of BAW resonators is formed, the device further comprising:
interconnects for operatively coupling the plurality of BAW resonators to form an acoustic filter.

14. A method comprising:
providing a target Q factor for a resonator;
providing a first pattern representative of a first electrode, the pattern having a closed-loop contour line having fractal dimensions based on a parameterized fractal function or an arbitrary suitable function that is subjected to parametrization and fractalization, the fractal dimensions being greater than one and less than two;
providing a second pattern representative of an area of a second electrode to be layered with the first electrode, the layering of the second pattern and the first pattern representing an effective area of the resonator; and
determining whether the target Q factor is met for the resonator based on the area and the perimeter of the closed-loop contour line.

15. The method according to claim 14, wherein the determining of whether the target Q factor is met includes analyzing the closed-loop contour line based on modeling or particle counting.

16. The method according to claim 14, further comprising:
updating the first pattern until the target Q factor is met for the resonator, the target Q factor being based on specification information for the resonator; and
storing the updated first pattern as a final pattern for forming the first electrode once the target Q factor is met.

17. The method according to claim 16, wherein the step of updating the first pattern includes applying a fractal generator function to the closed-loop contour line, the fractal generator function having self-similarity to the fractal dimensions of the closed-loop contour line.

18. The method according to claim 14, further comprising:
updating the second pattern until the target Q factor is met for the resonator, the target Q factor being based on specification information for the resonator; and
storing the updated second pattern as a final pattern for forming the second electrode once the target Q factor is met.

19. The method according to claim 18, wherein the step of updating the second pattern includes applying a fractal generator function to a closed-loop contour line of the second pattern, the closed-loop contour line of the second pattern having fractal dimensions based on a parameterized fractal function or an arbitrary suitable function that is subjected to parametrization and fractalization, the fractal dimensions being greater than one and less than two.

20. The method according to claim 18, wherein the fractal generator function has self-similarity to the fractal dimensions of the closed-loop contour line of the second pattern.

* * * * *